United States Patent
Koo et al.

(10) Patent No.: US 8,350,267 B2
(45) Date of Patent: Jan. 8, 2013

(54) FLAT PANEL DISPLAY

(75) Inventors: Jae-Bon Koo, Yongin-si (KR); Ji-Yong Park, Suwon-si (KR); Sang-Il Park, Suwon-si (KR); Ki-Yong Lee, Yongin-si (KR); Ul-Ho Lee, Kongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 1080 days.

(21) Appl. No.: 12/104,749

(22) Filed: Apr. 17, 2008

(65) Prior Publication Data

US 2008/0191969 A1    Aug. 14, 2008

Related U.S. Application Data

(62) Division of application No. 10/823,713, filed on Apr. 14, 2004, now Pat. No. 7,417,252.

(30) Foreign Application Priority Data

Jul. 18, 2003  (KR) .................. 10-2003-0049075
Jul. 18, 2003  (KR) .................. 10-2003-0049076

(51) Int. Cl.
*H01L 27/14*  (2006.01)

(52) U.S. Cl. ............ 257/72; 257/66; 257/352; 257/401; 257/E21.412; 257/E51.018

(58) Field of Classification Search .................. 257/66, 257/72, 352, 401
See application file for complete search history.

(56) References Cited

U.S. PATENT DOCUMENTS

| | | | |
|---|---|---|---|
| 5,620,905 A | 4/1997 | Konuma et al. | |
| 5,827,755 A | 10/1998 | Yonehara et al. | |
| 5,858,823 A | 1/1999 | Yamazaki et al. | |
| 5,969,396 A * | 10/1999 | Iwasa et al. ................... | 257/408 |
| 6,506,635 B1 | 1/2003 | Yamazaki et al. | |
| 6,529,213 B1 | 3/2003 | Kimura | |
| 6,674,136 B1 | 1/2004 | Ohtani | |
| 2001/0012702 A1 | 8/2001 | Kim | |
| 2003/0062499 A1 | 4/2003 | Yamazaki | |
| 2003/0147018 A1 | 8/2003 | Sano et al. | |
| 2004/0066147 A1 | 4/2004 | Park et al. | |
| 2004/0096999 A1 | 5/2004 | Lin et al. | |
| 2004/0169182 A1 | 9/2004 | Koo et al. | |

(Continued)

FOREIGN PATENT DOCUMENTS

CN     127662     12/2000

(Continued)

*Primary Examiner* — A. Sefer
(74) *Attorney, Agent, or Firm* — H.C. Park & Associates, PLC

(57) ABSTRACT

A high-speed flat panel display has thin film transistors in a pixel array portion in which a plurality of pixels are arranged and a driving circuit portion for driving the pixels of the pixel array portion, which have different resistance values than each other or have different geometric structures than each other. The flat panel display comprises a pixel array portion where a plurality of pixels are arranged, and a driving circuit portion for driving the pixels of the pixel array portion. The thin film transistors in the pixel array portion and the driving circuit portion have different resistance values in their gate regions or drain regions than each other, or have different geometric structures than each other. One thin film transistor has a zigzag shape in its gate region or drain region or has an offset region.

5 Claims, 8 Drawing Sheets

U.S. PATENT DOCUMENTS

| | | |
|---|---|---|
| 2004/0207582 A1 | 10/2004 | Koo et al. |
| 2005/0247940 A1 | 11/2005 | Shibata et al. |

FOREIGN PATENT DOCUMENTS

| | | |
|---|---|---|
| CN | 1276622 | 12/2000 |
| EP | 1033755 | 9/2000 |
| JP | 7-263705 | 10/1995 |
| JP | 8-139335 | 5/1996 |
| JP | 8-160464 | 6/1996 |
| JP | 9-146119 | 6/1997 |
| KR | 10-2004-0041982 | 5/2004 |

* cited by examiner

FLAT PANEL DISPLAY

CROSS-REFERENCE TO RELATED APPLICATION

This application is a divisional application of U.S. patent application Ser. No. 10/823,713, filed on Apr. 14, 2004, which claims the benefits of Korean Patent Applications No. 2003-49075 and 2003-49076, filed on Jul. 18, 2003, the disclosures of which are incorporated herein by reference in its entirety.

FIELD OF THE INVENTION

The present invention relates to a full-color flat panel display and, more particularly, to a high-speed flat panel display with a long lifetime, wherein thin film transistors forming a pixel array portion and a driving circuit portion have different resistance values each other.

BACKGROUND OF THE INVENTION

Generally, an active matrix organic light emitting diode (AMOLED) in a flat panel display, as shown in FIG. 1, includes a pixel array portion 110 where a plurality of pixels are arranged on an insulating substrate 100 in the form of matrix, and a driving circuit portion for driving the pixel array portion 110. The pixel array portion 110 includes a plurality of gate lines, a plurality of data lines, a plurality of common power lines, and a plurality of pixels connected to these lines, in the form of matrix (not shown in FIG. 1). Each of pixels comprises an electroluminesence (EL) device, a driving transistor for supplying a driving current in accordance with a data signal from the data line to the EL device, a switching transistor for transferring the data signal to the driving transistor in response to a scanning signal applied to the gate line, and a capacitor for storing the data signal.

The driving circuit portion for driving the pixels of the pixel array portion 110 comprises a gate driving circuit portion 130 for supplying the scanning signal for driving the gate line of the pixel array portion 110, and a data driving circuit portion 120 for supplying the data signal to the data line of the pixel array portion 110.

In a conventional AMOLED, all of thin film transistors of the pixel array portion 110 and thin film transistors of the driving circuit portions 120 and 130 consist of polysilicon thin film transistors. However, in an AMOLED having a 180 ppi resolution or higher where the pixel array portion and the driving circuit portion consist of polysilicon thin film transistors (poly-TFTs), a high speed operating characteristic of the driving circuit portion could be achieved from high mobility of the poly-TFTs. However, the on-current of the poly-TFT is extremely high so that the amount of current flowing through the EL device of the pixel array portion exceeds the limit value, thereby increasing the luminance per unit area and shortening the lifetime of the EL device.

Meanwhile, where the pixel array portion and the driving circuit portion consist of TFTs having a lower mobility to maintain the on-current characteristic at a required level, the on-current becomes relatively low in the pixel array portion so that the proper luminance is generated, thereby solving the lifetime problem of the EL device. However, the high speed-operating characteristic of the driving circuit portion are not satisfied.

SUMMARY OF THE INVENTION

An aspect of the present invention provides a high-speed flat panel display with a long lifetime. Another aspect of the present invention provides a flat panel display with a high speed operating characteristic and a longer lifetime by having thin film transistors of the pixel portion and thin film transistors of the driving circuit portion with different resistance values than each other.

A further aspect of the present invention provides a flat panel display with an increased lifetime and a high speed operating characteristic by changing doping concentrations of gate regions and drain regions of thin film transistors in the pixel array portion and the driving circuit portion.

A further aspect of the present invention provides a flat panel display with an increased lifetime and a high speed operating characteristic by making gate regions and drain regions of thin film transistors in the pixel array portion and the driving circuit portion have different shapes.

According to an exemplary embodiment of the present invention, a flat panel display comprises a pixel array portion where a plurality of pixels are arranged, and a driving circuit portion for driving the pixels of the pixel array portion, wherein thin film transistors in the pixel array portion and the driving circuit portion have different resistance values than each other.

At least one thin film transistor of the thin film transistors in the pixel array portion has a resistance value higher than the thin film transistors in the driving circuit portion.

In addition, according to another exemplary embodiment of the present invention provides a flat panel display which comprises a pixel array portion where a plurality of pixels are arranged, and a driving circuit portion for driving the pixels of the pixel array portion, wherein thin film transistors in the pixel array portion and the driving circuit portion have different resistance values in their gate regions than each other.

One thin film transistor of the thin film transistors in the pixel array portion and the thin film transistors in the driving circuit portion includes an offset region in its gate region.

The offset region is a high resistance region, which is partially doped with a relatively low concentration of impurities of the same conductivity type as source/drain regions.

According to a further exemplary embodiment of the present invention, a flat panel display comprises a pixel array portion where a plurality of pixels are arranged, and a driving circuit portion for driving the pixels of the pixel array portion, wherein thin film transistors in the pixel array portion and the driving circuit portion have different resistance values at least in their drain regions than each other.

One thin film transistor of the thin film transistors in the pixel array portion and the thin film transistors in the driving circuit portion includes an offset region at least in its drain region. The offset region is a high resistance region, which is partially doped with a low concentration of impurities of the same conductivity type as the drain region.

An additional exemplary embodiment of the present invention provides a flat panel display which comprises a pixel array portion where a plurality of pixels are arranged, and a gate driving circuit portion and a data driving circuit portion for driving the pixels of the pixel array portion, wherein at least one thin film transistor of thin film transistors in the pixel array portion has a different resistance value than at least one thin film transistor of thin film transistors in the gate driving circuit portion and the data driving circuit portion.

The at least one thin film transistor of the thin film transistors in the pixel array portion include an offset region in its gate region or drain region. The offset region is a high resistance region, which is partially doped with a low concentration of impurities of the same conductivity type as the drain region.

According to another exemplary embodiment of the present invention, the present invention provides a flat panel display which comprises a pixel array portion where a plurality of pixels are arranged, and a driving circuit portion for driving the pixels of the pixel array portion, wherein thin film transistors in the pixel array portion and the driving circuit portion include gate regions having different geometric structures.

One thin film transistor of the thin film transistors in the pixel array portion and the thin film transistors in the driving circuit portion includes a zigzag shaped gate region or a gate region having same length and shorter width, same width and longer length, or shorter width and longer length than another thin film transistors.

The one thin film transistor of the thin film transistors includes multiple gates, and further includes a high resistance offset region between the multiple gates. The offset region of the one thin film transistor has a zigzag shape, or has a structure with longer length or shorter width than another thin film transistors.

A further exemplary embodiment of the present invention provides a pixel array portion where a plurality of pixels are arranged, and a driving circuit portion for driving the pixels of the pixel array portion, wherein thin film transistors in the pixel array portion and the driving circuit portion include drain regions having different geometric structures.

One thin film transistor of the thin film transistors in the pixel array portion and the thin film transistor in the driving circuit portion includes a zigzag shaped drain region, or includes a drain region having same length and shorter width, same width and longer length, or shorter width and longer length, than another thin film transistors.

The one thin film transistor of the thin film transistors has a high resistance offset region at least in its drain region. The drain offset region has a zigzag shape, or has a longer length, or has a shorter width, than another thin film transistor.

In addition, another exemplary embodiment of the present invention provides a pixel array portion where a plurality of pixels are arranged, and a gate driving circuit portion and a data driving circuit portion for driving the pixels of the pixel array portion, wherein at least one thin film transistor of thin film transistors in the pixel array portion has a different geometric structure than at least one thin film transistor of thin film transistors in the gate driving circuit portion and the data driving circuit portion.

The at least one thin film transistor of the thin film transistors in the pixel array portion includes an offset region in its gate region or drain region. The offset region has a zigzag shape, or has a longer length, or has a shorter width, than those of another thin film transistors in the gate driving circuit portion or data driving circuit portion.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

Figure 1:
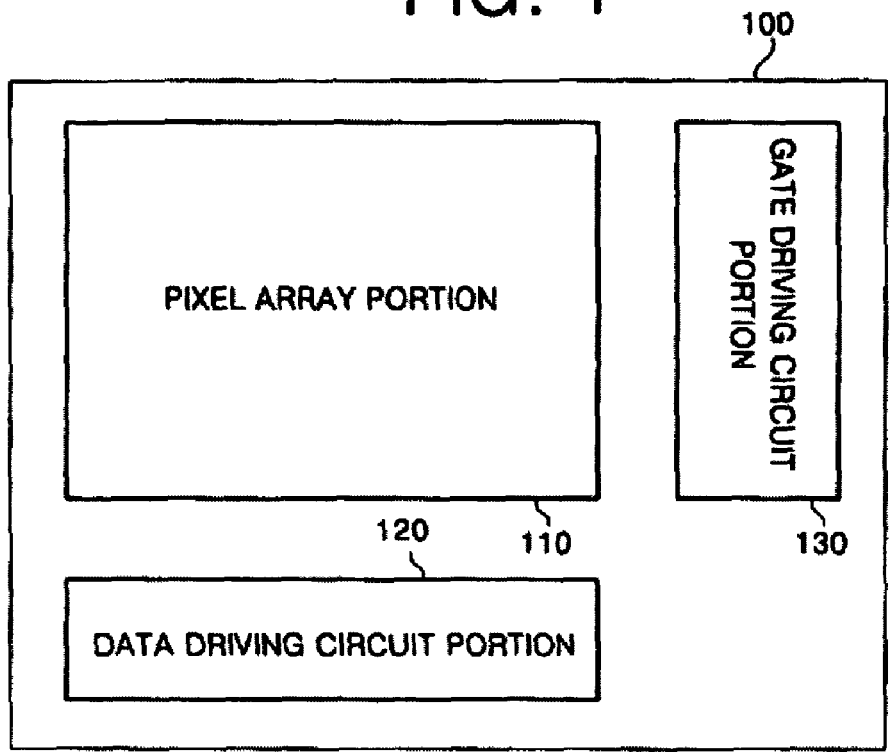
FIG. 1 shows a configuration of a conventional AMOLED.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout the specification.

Figure 2:
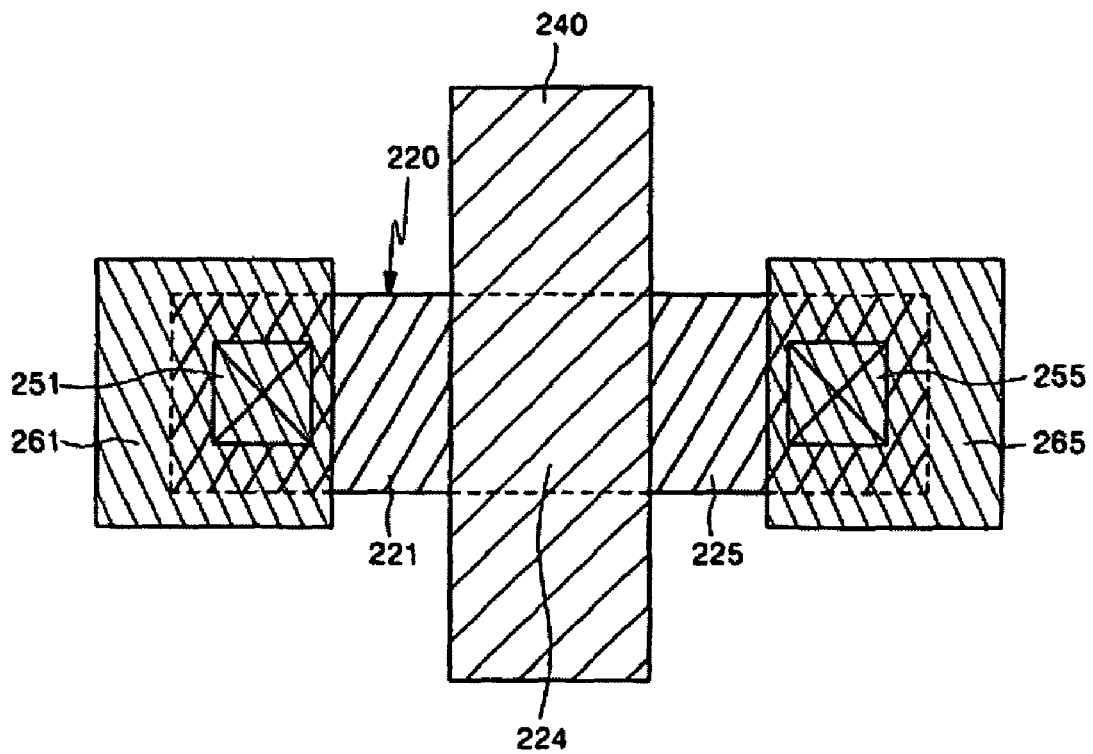
FIG. 2 shows a plane structure of a thin film transistor in a driving circuit portion of an AMOLED in accordance with an embodiment of the present invention.

FIG. 2 shows a plane structure of a thin film transistor of a driving circuit portion 10 of an AMOLED in accordance with the present invention. The driving circuit portion comprises a data driving circuit portion and a gate driving circuit portion.

Referring to FIG. 2, the thin film transistor in the driving circuit portion includes a semiconductor layer 220 comprised of a polysilicon film, etc., a gate electrode 240, and source/drain electrodes 261 and 265. The semiconductor layer 220 includes a channel region 224 corresponding to the gate electrode 240, and source/drain regions 221 and 225 formed at both sides of the channel region 224. The source/drain electrodes 261 and 265 are electrically connected to the source/drain regions 221 and 225 through contacts 251 and 255.

Figure 3A:
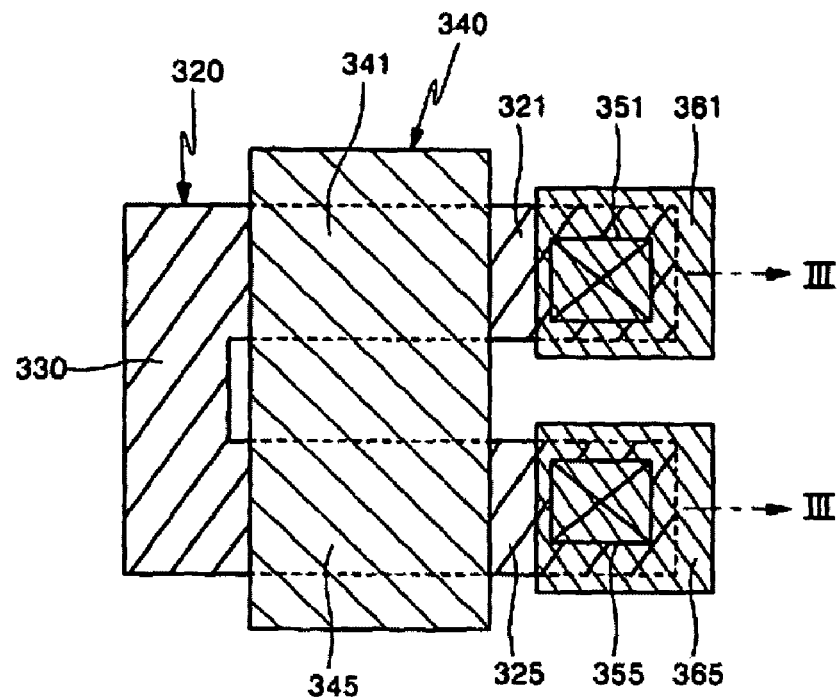
FIGS. 3A and 3B show plane and cross-sectional views of a thin film transistor in a pixel array portion of an AMOLED in accordance with a first embodiment of the present invention, respectively.
Figure 3B:
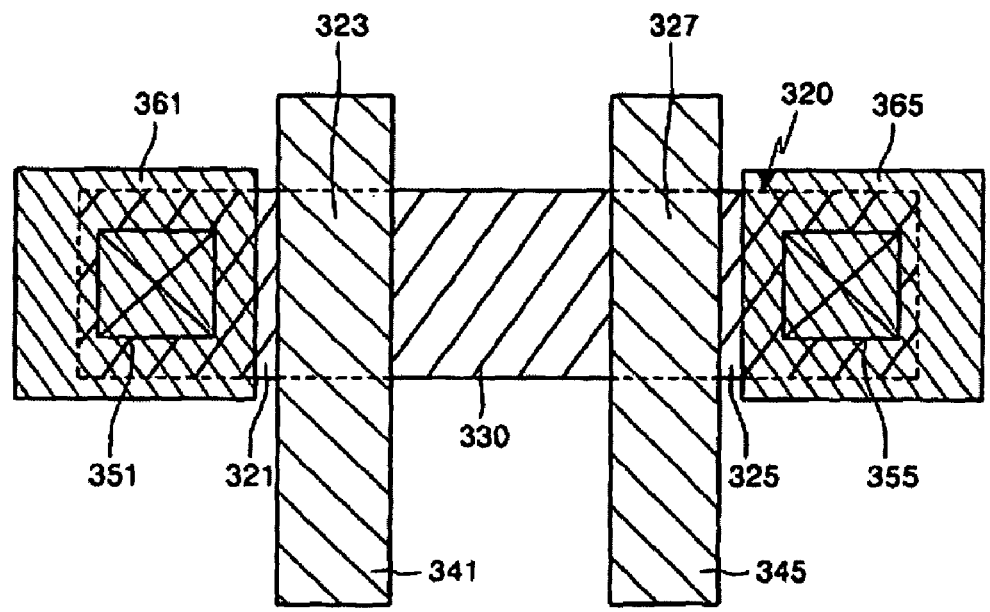

FIGS. 3A and 3B show plane and cross-sectional views of the thin film transistor in a pixel array portion of the AMOLED in accordance with a first embodiment of the present invention FIG. 3A illustrates the plane structure of the thin film transistor.

FIG. 3B is not a cross sectional view of FIG. 3A, but another embodiment of the invention.

Referring to FIGS. 3A and 3B, the thin film transistor of the pixel array portion includes a semiconductor layer 320, a gate electrode 340, and source/drain electrodes 361 and 365. The gate electrode 340 includes multiple gates 341 and 345 corresponding to the semiconductor layer 320.

The semiconductor layer 320 includes a "U" shaped structure having multiple channel regions 323 and 327 each corresponding to the multiple gates 341 and 345 of the gate electrode 340. High concentration source/drain regions 321 and 325 may be formed at one side of the channel regions 323 and 327. In addition, the semiconductor layer 320 further includes a gate offset region 330 formed between the multiple gates 341 and 345, i.e., the multiple channel regions 323 and 327. The source/drain electrodes 361 and 365 are electrically connected to the high concentration source/drain regions 321 and 325 formed on the semiconductor layer 320 through contacts 351 and 355.

The offset region 330 is an impurity region, which may be doped with a doping concentration lower than that of the high concentration source/drain regions 321 and 325 and may have the same conductivity type as the regions 321 and 325. Alternatively, a high resistance region may consist of an intrinsic region undoped with impurities.

Figure 4A:
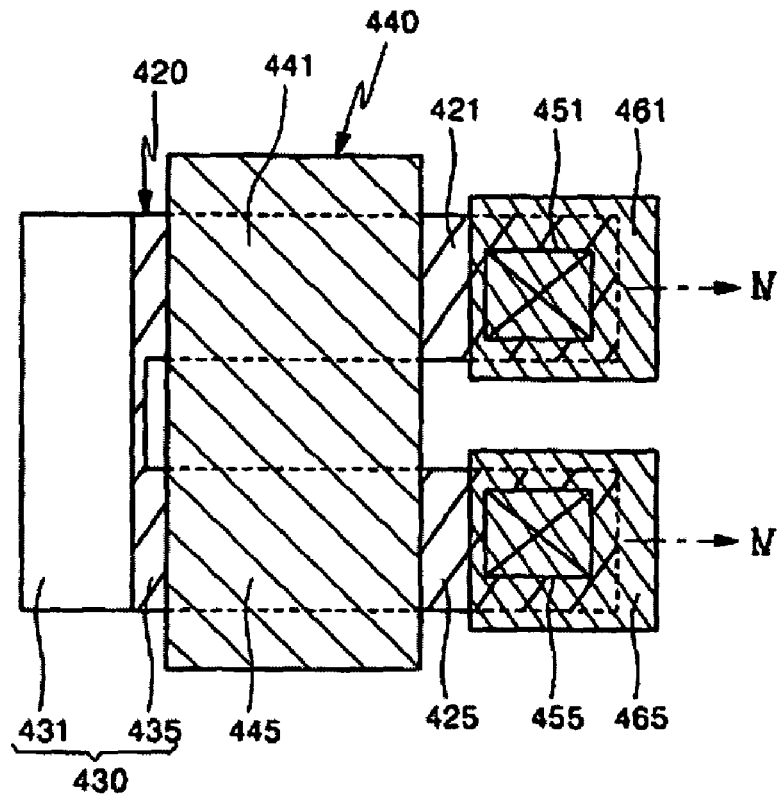
FIGS. 4A and 4B show plane and cross-sectional views of a thin film transistor in a pixel array portion of an AMOLED in accordance with a second embodiment of the present invention, respectively.
Figure 4B:
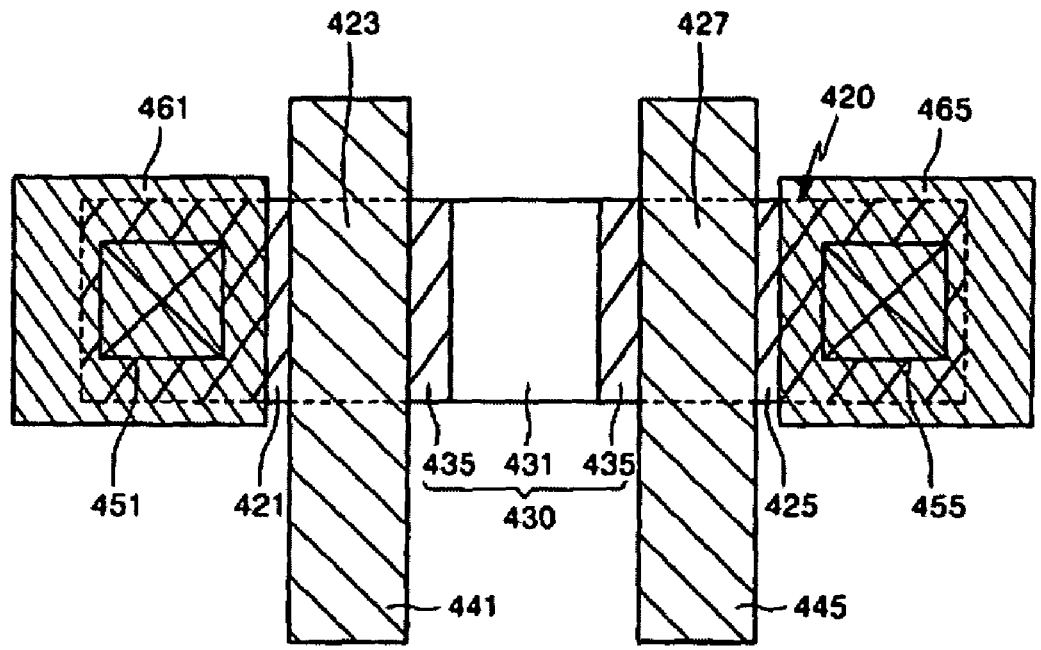

FIGS. 4A and 4B show a second example of the thin film transistors of the pixel array portion in the AMOLED in accordance with an embodiment of the present invention. FIG. 4A illustrates a plane view of the thin film transistor FIGS. 4A and 4B show the thin film transistor of the pixel array portion as shown in the first example of FIGS. 3A and 3B, wherein an amount of doping for the offset region between multiple gates is changed, thereby changing a resistance value.

The thin film transistor of the pixel portion includes a "U" shaped semiconductor layer 420, a gate electrode 440 and source/drain electrodes 461 and 465. The gate electrode 440 includes multiple gates 441 and 445 corresponding to the semiconductor layer. The source/drain electrodes 461 and 465 are electrically connected to high concentration source/drain regions 421 and 425 of the semiconductor layer 420 through contacts 451 and 455.

The semiconductor layer 420 includes multiple channel regions 423 and 427 corresponding to the multiple gates 441 and 445 of the gate electrode 440 respectively, and the high concentration source/drain regions 421 and 425 formed at one sides of multiple channel regions 423 and 427 respectively. In addition, the semiconductor layer 420 includes a gate offset region 430 formed between the multiple channel regions 423 and 427, i.e., between the multiple gates 441 and 445.

The offset region 430 is a high resistance offset region, which consists of regions 435 doped with a low concentration of impurities of the same conductivity type as the high concentration source/drain regions 421 and 425, and a region 431 undoped with impurities between the regions 435.

In the first and second embodiments, the thin film transistor of the pixel array portion has the high resistance offset region 430, which may range from no doping to partially doped to entirely doped with impurities of a relatively low concentration between the multiple gates, resulting in an increased resistance. Therefore, when the driving circuit portion consists of a thin film transistor shown in FIG. 2 and the pixel array potion consists of a thin film transistor having a high resistance offset region between the multiple gates as shown in FIGS. 3A and 3B and FIGS. 4A and 4B, the driving circuit portion may maintain a high speed operating characteristic in a typical AMOLED. The pixel array portion can decrease the amount of current flowing into the EL device resulting from the increased resistance of the thin film transistor at the same time, so that a lifetime can be extended.

In other words, given that the gate region is the offset region between the multi gates and the multi channel region under the multi gates in the thin film transistor of the pixel array portion of the first and second embodiments, and the gate region is the channel region under the gate in the thin film transistor of the driving circuit portion shown in FIG. 2, the gate region of the thin film transistor of the driving circuit portion has a small resistance value like a typical thin film transistor, so that the high speed operating characteristic can be maintained. Meanwhile, the gate region of the thin film transistor of the pixel array portion has a high resistance value based on the doping state of the offset region. Proper luminance may be generated by adjusting the amount of the current flowing through the EL device, so that the lifetime of the EL device can be extended.

Figure 5:
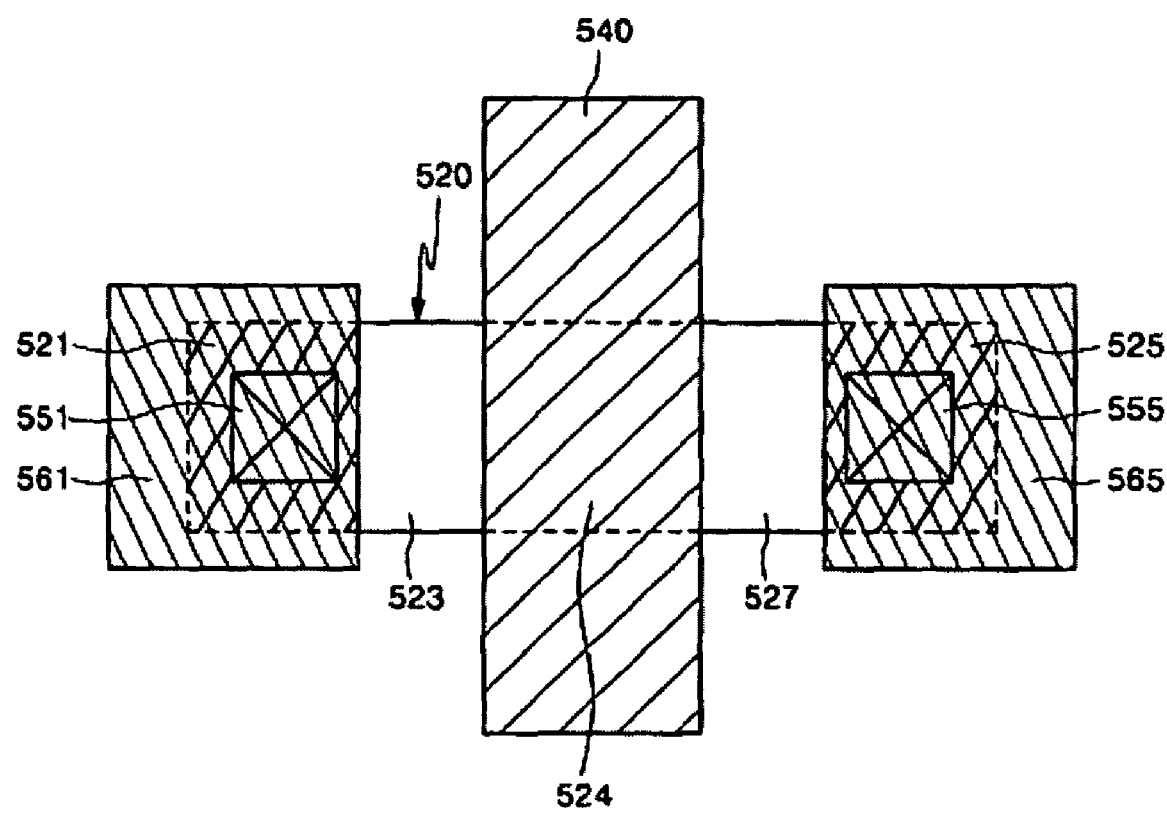
FIG. 5 shows a plane view of a thin film transistor in a pixel array portion of an AMOLED in accordance with a third embodiment of the present invention.

FIG. 5 shows a plane view of the thin film transistor of the pixel array portion of the AMOLED in accordance with a third embodiment of the present invention. Referring to FIG. 5, the thin film transistor in the pixel array portion includes a semiconductor layer 520 consisted of a polysilicon film, etc., a gate electrode 540 and source/drain electrodes 561 and 565. The semiconductor layer 520 includes a channel region 524 corresponding to the gate electrode 540, and source/drain regions 521 and 525 formed at both sides of the channel region 524. The source/drain electrodes 561 and 565 are electrically connected to the source/drain regions 521 and 525 through contacts 551 and 555.

The semiconductor layer 520 further includes source/drain offset regions 523 and 527 between the channel region 524 and the source/drain regions 521 and 525. The offset regions 523 and 527 are high resistance regions comprising intrinsic regions undoped with impurities.

The source/drain regions 521 and 525 of the thin film transistor of the pixel array portion in accordance with the third embodiment are shown to have the offset regions 523 and 527 respectively. However, it is understood that the offset region may be formed only in the drain region 525.

Figure 6:
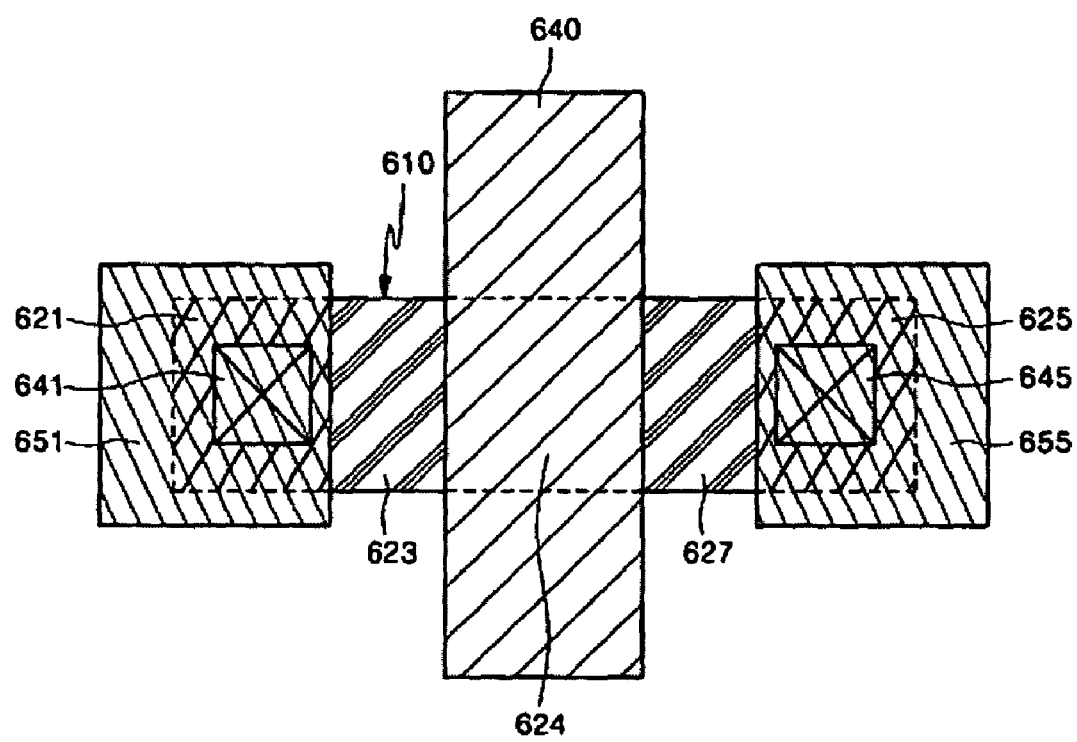
FIG. 6 shows a plane view of a thin film transistor in a pixel array portion of an AMOLED in accordance with a fourth embodiment of the present invention.

FIG. 6 shows a plane view of the thin film transistor of the pixel array portion of the AMOLED in accordance with the fourth embodiment of the present invention.

Referring to FIG. 6, the thin film transistor in the pixel portion includes a semiconductor layer 620 consisting of a polysilicon film, etc., a gate electrode 640 and source/drain electrodes 661 and 665. The semiconductor layer 620 includes a channel region 624 corresponding to the gate electrode 640, and source/drain regions 621 and 625 formed at both sides of the channel regions 624. The source/drain electrodes 651 and 655 are electrically connected to the source/drain regions 621 and 625 through contacts 641 and 645.

The semiconductor layer 620 further includes source/drain offset regions 623 20 and 627 between a channel region 623 and the source/drain regions 621 and 625. The offset regions 623 and 627 are high resistance regions, which are entirely or partially doped with a low concentration of impurities of the same conductivity type as the high concentration source/drain regions 621 and 625.

The source/drain regions 621 and 625 of the thin film transistor of the pixel array portion in accordance with a fourth embodiment are shown to have offset regions 623 and 627 respectively. However, it is understood that the offset region may be formed only in the drain region 625.

In the third and fourth embodiments, the thin film transistor of the pixel array portion includes an offset region formed at least in its drain region, so that a resistance value increases. Therefore, when the driving circuit portion consists of the thin film transistor shown in FIG. 2 and the pixel array portion consists of the thin film transistor having the drain offset region as shown in FIGS. 5 and 6, the driving circuit portion may maintain a high speed operating characteristic in a typical AMOLED, while the pixel array portion may decrease the amount of current flowing into the EL device resulting from the increased resistance of the thin film transistor at the same time, so that the lifetime of the device may be extended.

In other words, by changing a resistance value of the drain region of the thin film transistor of the pixel array portion in accordance with the third and fourth embodiments based on the doping state of the drain offset region, the drain region of the thin film transistor of the driving circuit portion has a small resistance value similar to the typical thin film transistor, so that a high speed operating characteristic is maintained. Since the drain region of the thin film transistor of the pixel array portion has a high resistance value, the lifetime of the EL device can be extended by the proper luminance generated by adjusting the amount of the current flowing into the EL device.

Figure 7A:
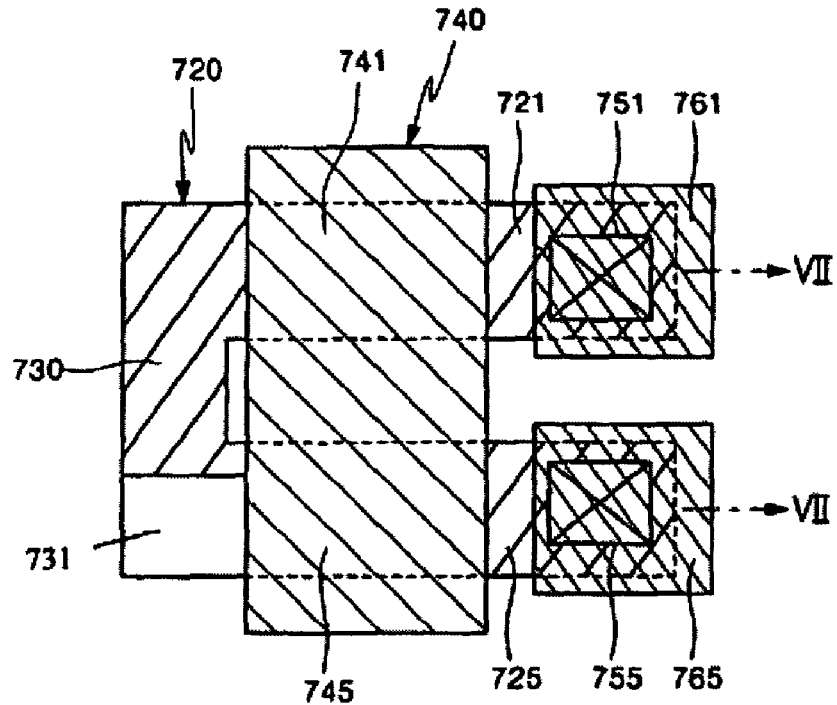
FIGS. 7A and 7B show plane and cross-sectional views of a thin film transistor in a pixel array portion of an AMOLED in accordance with a fifth embodiment of the present invention, respectively.
Figure 7B:
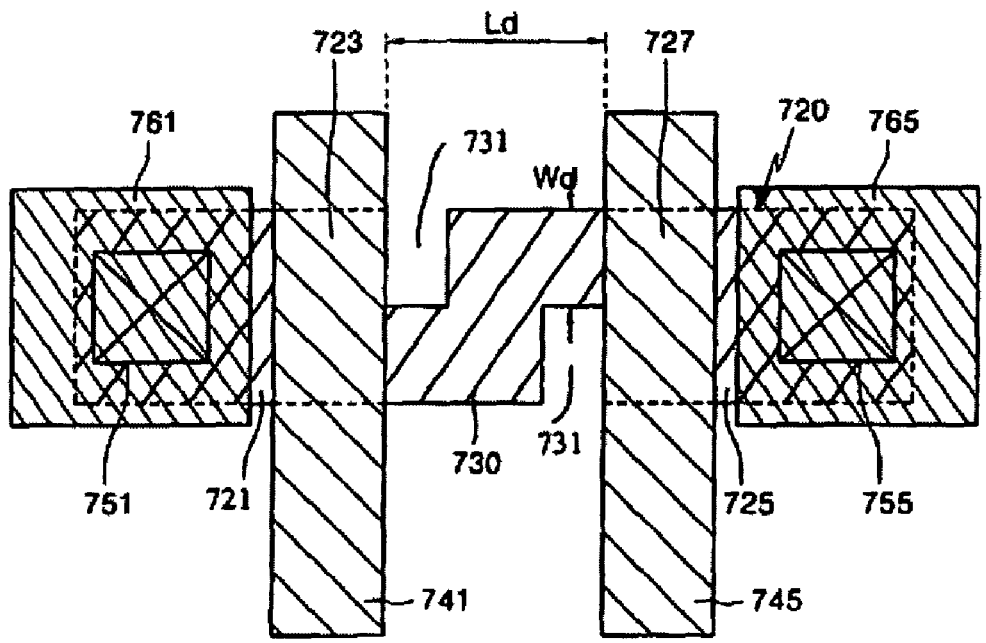

FIGS. 7A and 7B show a thin film transistor in the pixel array portion of the AMOLED in accordance with a fifth embodiment of the present invention. FIG. 7A illustrates a plane structure of the thin film transistor.

Referring to FIGS. 7A and 7B, the thin film transistor of the pixel array portion includes a semiconductor layer 720, a gate electrode 740 and source/drain electrodes 761 and 765. The gate electrode 740 includes multiple gates 741 and 745 corresponding to the semiconductor layer 720.

The semiconductor layer 720 includes a "U" shaped structure having multiple channel regions 723 and 727 each corresponding to the multiple gates 741 and 745 of the gate electrode 740, and high concentration source/drain regions 721 and 725 formed at one sides of the channel regions 723 and 727. In addition, the semiconductor layer 720 further includes a gate offset region 730 formed between the multiple gates 741 and 745, i.e., the multiple channel regions 723 and 727. The source/drain electrodes 761 and 765 are electrically connected to the high concentration source/drain regions 721 and 725 formed on the semiconductor layer 720 through contacts 751 and 755, respectively.

The offset region 730 has a zigzag shape and is a high resistance region, which may consist of low concentration impurity regions entirely or partially doped with impurities of the same conductivity types as the high concentration source/drain regions 721 and 725, or may consist of an intrinsic region undoped with impurities. The bottom left corner of the offset region 730 shown in FIG. 7A refers to a void area 731 relating to the zigzag shape of the offset region 730. As shown in the cross-sectional view of the thin film transistor of FIG. 7B, the offset region 730 has multiple void areas 731 related to the zigzag shape of the offset region 730.

Figure 8A:
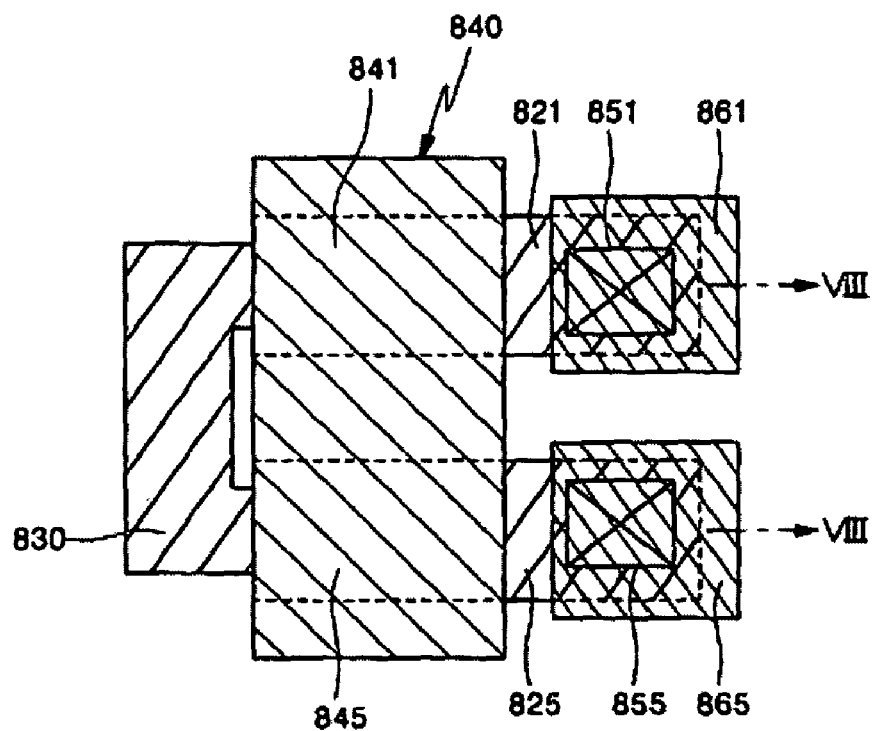
FIGS. 8A and 8B show plane and cross-sectional views of a thin film transistor in a pixel array portion of an AMOLED in accordance with a sixth embodiment of the present invention, respectively.
Figure 8B:
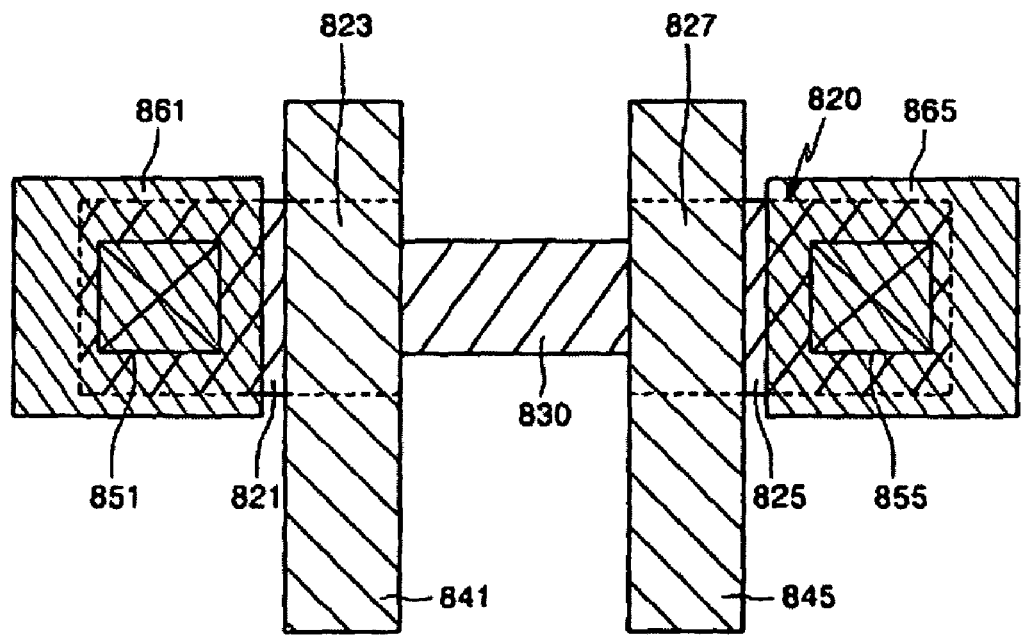

FIGS. 8A and 8B show the thin film transistor of the pixel array portion of the AMOLED in accordance with a sixth embodiment of the present invention. FIG. 8A illustrates a plane structure of the thin film transistor.

FIGS. 8A and 8B show the thin film transistor of the pixel array portion as shown in the fifth example of FIGS. 7A and 7B, wherein a shape of the offset region between multiple gates is changed, thereby increasing the resistance value.

The thin film transistor of the pixel portion includes a "U" shaped semiconductor layer 820, a gate electrode 840 and source/drain electrodes 861 and 865. The gate electrode 840 includes multiple gates 841 and 845 corresponding to the semiconductor layer 820. The source/drain electrodes 861 and 865 are electrically connected to high concentration source/drain regions 821 and 825 formed on the semiconductor layer 820 through contacts 851 and 855 respectively.

The semiconductor layer 820 includes multiple channel regions 823 and 827 corresponding to multiple gates 841 and 845 of the gate electrode 840, and the high concentration source/drain regions 821 and 825 formed at one side of the multiple channel regions 823 and 827, respectively. In addition, the semiconductor layer 820 includes a gate offset region 830 formed between the multiple channel regions 823 and 827, i.e., between the multiple gates 841 and 845.

The offset region 830 may have a relatively high resistance value by changing the shape so that the width of the offset region is smaller than that of the typical offset region. The offset region 830 is a high resistance region, which may consist of low concentration impurity regions entirely or partially doped with impurities of the same conductivity type as the high concentration source/drain regions 821 and 825 at a doping concentration lower than those of the high concentration source/drain regions 821 and 825, or may consist of an intrinsic regions undoped with impurities The length Ld of the offset region may be constantly maintained while the width Wd of the offset region is decreased, the width Wd may be constantly maintained while the length Ld is increased, or the width Wd may be decreased while the length Ld is increased, so that a resistance value of the offset region can be adjusted by changing a size Wd/Ld of the offset region 830. This change of the shape of the affect region may be based on the sixth embodiment of the present invention.

In accordance with the fifth and sixth embodiments, the thin film transistor of the pixel array portion may include an offset region formed between the multiple gates, and the shape of the offset region may be changed to a zigzag shape, or the size of the offset region may be adjusted, thereby increasing a resistance value. When the driving circuit portion includes the thin film transistors as shown in FIG. 2 and the pixel array potion includes the thin film transistor having a high resistance offset region between the multiple gates as shown in FIGS. 7A and 7B and FIGS. 8A and 8B, the driving circuit portion can maintain a high speed operating characteristic in a typical AMOLED. Further, the pixel array portion can decrease the amount of current flowing into the EL device resulted from the increased resistance of the thin film transistor at the same time, so that the lifetime of the device can be extended.

In other words, the gate region may be the offset region between the multi gates, 20 and a multi channel region may be arranged under the multi gates in the thin film transistor of the pixel array portion in the fifth and sixth embodiments. Further, the gate region may be a channel region arranged under the gate in the thin film transistor of the driving circuit portion shown in FIG. 2, and the gate region of the thin film transistor of the driving circuit portion may have a small resistance value compared to the typical thin film transistor, so that the high speed operating characteristics can be maintained. The gate region of the thin film transistor of the pixel array portion has a high resistance value based on the shape change of the offset region, while the proper luminance is generated by adjusting the amount of the current flowing into the EL device, so that the lifetime of the EL device can be extended.

Figure 9:
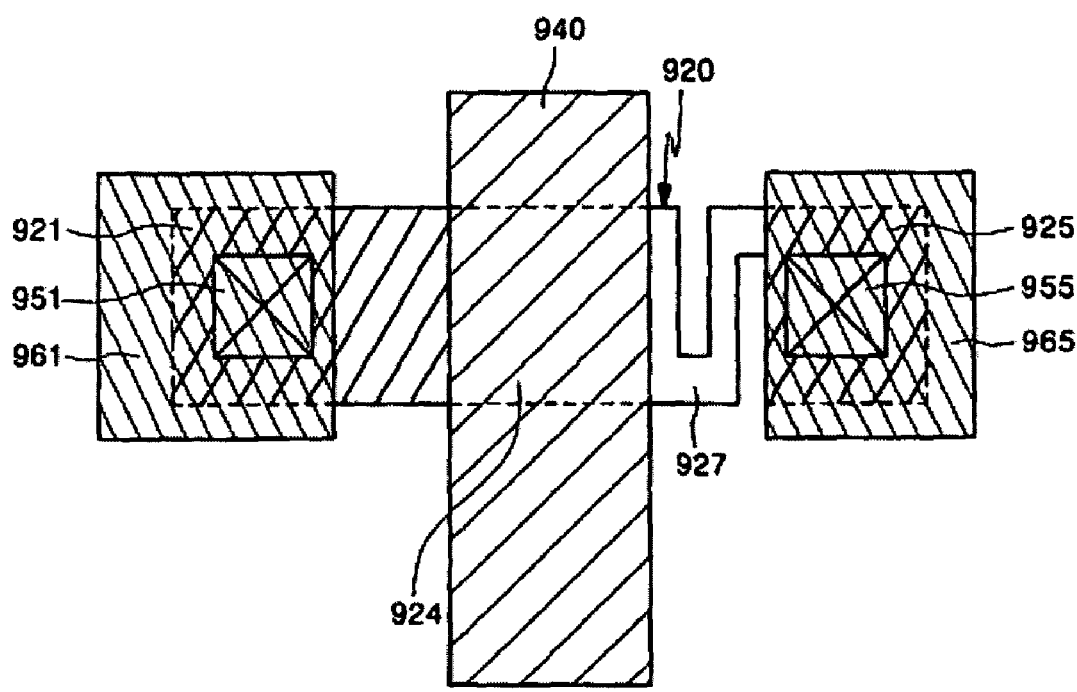
FIG. 9 shows a plane view of a thin film transistor in a pixel array portion of an AMOLED in accordance with a seventh embodiment of the present invention.

FIG. 9 shows a third example of the thin film transistor of the pixel array portion of the AMOLED in accordance with an embodiment of the present invention.

Referring to FIG. 9, the thin film transistor in the pixel array portion includes a semiconductor layer 920 having a polysilicon film, etc., a gate electrode 940 and source/drain electrodes 961 and 965. The semiconductor layer 920 includes a channel region 924 corresponding to the gate electrode 940, and source/drain regions 921 and 925 formed at both sides of the channel region 924. The source/drain electrode 961 and 965 are electrically connected to the source/drain regions 921 and 925 through contacts 951 and 955.

The semiconductor layer 920 further includes an offset region 927 between the 15 channel region 924 and the drain region 925. The offset region 927 has a zigzag shape. Based on the method for changing the shape of the drain offset region as used in the seventh embodiment, the method for changing size of the offset region 927 may include maintaining the length of the drain region as constant while the width of the drain region is decreased. Alternatively, the width may be maintained as constant while the length is increased, or the width may be decreased while the length is increased.

The drain region 925 of the thin film transistor of the pixel array portion in accordance with the seventh embodiment is only shown to have the offset region 927. However, it is understood that the offset region can be formed in either or both the source/drain regions 921 and 925.

In accordance with the fifth and seventh embodiments, the drain region 925 of the thin film transistor of the pixel array portion may include the offset region 927 so that a resistance value increases. Therefore, when the driving circuit portion includes the thin film transistors as shown in FIG. 2 and the pixel array potion includes the thin film transistor having the drain offset region as shown in FIG. 9, the driving circuit can maintain a high speed operating characteristic in a typical AMOLED. Further, the pixel array portion can decrease the amount of current flowing into the EL device resulting from the increased resistance of the thin film transistor at the same time, so that the lifetime of the device can be extended.

By changing a resistance value of the drain region of the thin film transistor of the pixel array portion in accordance with the seventh embodiment using the shape change of the drain offset region, the drain region of the thin film transistor of the driving circuit portion has a small resistance value compared to the typical thin film transistor, so that a high speed operating characteristic is maintained. Since the drain region of the thin film transistor of the pixel array portion has a high resistance value, the lifetime of the EL device can be extended by the proper luminance generated by adjusting the amount of the current flowing into the EL device.

In accordance with embodiments of the present invention, a high resistance offset region may be formed between multiple gates of the thin film transistor of the pixel array portion or in the drain region. The amount of current flowing into the EL device may be adjusted by changing the resistance value of the thin film transistor of the pixel array portion based on the doping state of the offset region. All of thin film transistors forming the pixel array portion may have the offset regions, or the only thin film transistors of interest may have the offset region.

The high resistance offset region in accordance with embodiments of the present invention may be applied to all of the thin film transistors forming the pixel array portion, and may be applied to at least one of thin film transistors in the pixel array portion, for example, to the thin film transistor only for driving EL.

It is shown that the semiconductor layer includes a "U" shaped structure and the gate electrode includes dual gates in the embodiment of the present invention. However, it is also possible for the semiconductor layer and the gate to have a structure for changing a resistance value of the thin film transistor of the pixel array portion.

In accordance with embodiments of the present invention, a resistance value is changed by adjusting a doping state or a shape of the gate offset region or drain offset region of the thin film transistor of the pixel array portion, so that a high speed operating characteristic can be achieved and the lifetime of the device can be extended by properly controlling the current flowing into the EL device.

While the present invention has been described with reference to various embodiments, it is understood that the disclosure has been made for purpose of illustrating the invention by way of examples and is not to limit the scope of the invention. One skilled in the art may amend and/or change the present invention without departing from the scope and spirit of the invention.

What is claimed is:

1. A flat panel display, comprising:
    a pixel array portion having a plurality of pixels arranged thereon; and
    a gate driving circuit portion and a data driving circuit portion for driving the plurality of pixels of the pixel array portion,
    wherein a first semiconductor layer of at least one thin film transistor of thin film transistors in the pixel array portion has a first region between its drain region and its source region, the first region being asymmetric with respect to its channel region, and the first region has a different shape, when viewed from above perpendicular to the flat panel display, from a second region of a second semiconductor layer of at least one thin film transistor of thin film transistors in the gate driving circuit portion and thin film transistors in the data driving circuit portion, the second region being disposed between a source region and a drain region of the second semiconductor layer.

2. The flat panel display according to claim 1, wherein the first semiconductor layer includes an offset region.

3. The flat panel display according to claim 2, wherein the offset region has a zigzag shape.

4. The flat panel display according to claim 2, wherein the width of the offset region varies from the drain region to the source region.

5. A flat panel display, comprising:
    a pixel array portion having a plurality of pixels arranged thereon; and
    a gate driving circuit portion and a data driving circuit portion for driving the plurality of pixels of the pixel array portion,
    wherein at least one thin film transistor of thin film transistors in the pixel array portion has a different geometric structure from at least one thin film transistor of thin film transistors in the gate driving circuit portion and thin film transistors in the data driving circuit portion,
    wherein the at least one thin film transistor of the thin film transistors in the pixel array portion includes an offset region in one of its gate region and its drain region, and
    wherein the offset region of the at least one thin film transistor in the pixel array portion has at least one of a longer length and a shorter width than those of the other thin film transistors.

* * * * *